United States Patent
Lan

(10) Patent No.: US 11,988,970 B2
(45) Date of Patent: May 21, 2024

(54) METHOD FOR DETECTING DEFECT IN SEMICONDUCTOR FABRICATION PROCESS

(71) Applicant: CHANGXIN MEMORY TECHNOLOGIES, INC., Hefei (CN)

(72) Inventor: Yuan-Ku Lan, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 447 days.

(21) Appl. No.: 17/386,487

(22) Filed: Jul. 27, 2021

(65) Prior Publication Data
US 2021/0356870 A1    Nov. 18, 2021

Related U.S. Application Data

(63) Continuation of application No. PCT/CN2021/079600, filed on Mar. 8, 2021.

(30) Foreign Application Priority Data

Mar. 10, 2020 (CN) .......................... 202010162151.2

(51) Int. Cl.
*G03F 7/00* (2006.01)
(52) U.S. Cl.
CPC ................................. *G03F 7/7065* (2013.01)
(58) Field of Classification Search
CPC .................................................. G03F 7/7065
USPC ........................................................... 430/30
See application file for complete search history.

(56) References Cited

U.S. PATENT DOCUMENTS

| | | | |
|---|---|---|---|
| 4,800,282 A | 1/1989 | Nishimura | |
| 7,291,564 B1 | 11/2007 | Jackson | |
| 9,310,315 B2 * | 4/2016 | Zhang | ..................... C07F 5/022 |
| 9,921,487 B2 * | 3/2018 | Park | ..................... G03F 7/70625 |
| 2003/0036006 A1 | 2/2003 | Feke | |
| 2017/0103924 A1 | 4/2017 | Park et al. | |
| 2020/0350218 A1 | 11/2020 | Kuo et al. | |

FOREIGN PATENT DOCUMENTS

| | | |
|---|---|---|
| CN | 102207676 A | 10/2011 |
| CN | 107065436 A | 8/2017 |
| CN | 109946928 A | 6/2019 |
| CN | 111863601 A | 10/2020 |
| JP | S6281634 A | 4/1987 |
| JP | H0643110 A | 2/1994 |
| JP | H08286390 A | 11/1996 |

OTHER PUBLICATIONS

Third Office Action of the Chinese application No. 202010162151.2, dated Sep. 29, 2022, 8 pgs.
English translation of the Written Opinion of the International Search Authority in the international application No. PCT/CN2021/079600, dated May 31, 2021, 4 pgs.
First Office Action of the Chinese application No. 202010162151.2, dated Feb. 16, 2022, 15 pgs.
Second Office Action of the Chinese application No. 202010162151.2, dated Jul. 22, 2022, 17 pgs.
International Search Report in the international application No. PCT/CN2021/079600, dated May 31, 2021, 2 pgs.

* cited by examiner

*Primary Examiner* — Christopher G Young
(74) *Attorney, Agent, or Firm* — Cooper Legal Group, LLC

(57) ABSTRACT

A method for detecting a defect in a semiconductor fabrication process is disclosed. The method includes forming photoresist on a substrate; forming a fluorescent agent in the photoresist; and detecting the defect of the photoresist after being subjected to developing by utilizing the fluorescent agent.

3 Claims, 4 Drawing Sheets

METHOD FOR DETECTING DEFECT IN SEMICONDUCTOR FABRICATION PROCESS

CROSS-REFERENCE TO RELATED APPLICATION

This disclosure is a continuation application of International Application No.: PCT/CN2021/079600, filed on Mar. 8, 2021, which claims priority to Chinese patent application No. 202010162151.2, filed on Mar. 10, 2020 and entitled "METHOD FOR DETECTING DEFECT IN SEMICONDUCTOR FABRICATION PROCESS". International Application No.: PCT/CN2021/079600 and Chinese patent application No. 202010162151.2 are hereby incorporated by reference in their entireties.

BACKGROUND

A fabrication process of a semiconductor device usually includes several steps. A minor error in any process step may cause failure of the semiconductor device, and thus it should be guaranteed that each of the process steps in a fabrication process meets the process requirements.

Main process steps for manufacturing a semiconductor device include lithography, etching, ion implantation and the like. Lithography includes photoresist applying, exposing, developing, etc. During an actual process, defects may exist in the photoresist after developing due to problems such as in a process. For example, as shown in FIG. 1, a whole layer of photoresist 120' is applied on a side of a surface of a substrate 110', which is patterned through exposing and developing. That is, the photoresist 120' in a reserved region R' is retained, and meanwhile the photoresist 120' in an etching region E' is removed. Due to insufficient irradiation, photoresist deterioration or other factors, a phenomenon that a photoresist residue 130' exists in the etching region E' may occur. In the prior art, the light intensity of a reflected light of the etching region E' is acquired usually through an optical detector, and it can be determined whether the photoresist residue 130' exists in the etching region E' or not according to the light intensity of the reflected light. However, when the photoresist residue 130' is small in size, the photoresist residue 130' may not be detected. In this case, errors may occur to the follow-up steps, thereby finally resulting in failure of the semiconductor device.

SUMMARY

Examples of the disclosure relate to the field of semiconductor fabrication, in particular to a method for detecting a defect in a semiconductor fabrication process.

The disclosure provides a method for detecting a defect in a semiconductor fabrication process so as to lower the difficulty for detection of a defect in the photoresist after being subjected to developing and improve the accuracy for detection of a defect.

In a first aspect, an example of the disclosure provides a method for detecting a defect in a semiconductor fabrication process, including the following steps.

Photoresist is formed on a substrate.

A fluorescent agent is formed in the photoresist.

The defect of the photoresist after being subjected to developing is detected by utilizing the fluorescent agent.

In some examples, a structure of the fluorescent agent includes any one or a combination of —C=C—C=C—C=C— or —N=C—C=N—C=C—.

In some examples, the fluorescent agent is any one or any combination of a toluylene based fluorescent agent, a coumarin based fluorescent agent, a pyrazoline based fluorescent agent, a benzoxazole based fluorescent agent and a dicarboximide based fluorescent agent.

In some examples, a concentration of the fluorescent agent in the photoresist is larger than 0% and smaller than 1%.

In some examples, a pH value of the photoresist formed with the fluorescent agent is larger than 0 and smaller than 6.

In some examples, an emission wavelength of the fluorescent agent is in a range from 420 nm to 450 nm.

In some examples, the step of forming the fluorescent agent in the photoresist includes the following step.

The fluorescent agent is injected into the photoresist by means of an ion implantation.

In some examples, the step of injecting the fluorescent agent into the photoresist by means of the ion implantation further includes the following steps.

The photoresist is subjected to exposing and developing.

The fluorescent agent is injected into the photoresist after it is subjected to developing.

In some examples, the step of injecting the fluorescent agent into the photoresist by means of the ion implantation further includes the following steps.

The photoresist is baked at a temperature equal to or higher than a glass transition temperature of the photoresist; and the fluorescent agent is injected into the photoresist by means of the ion implantation.

In some examples, the temperature for the baking is in a range from 50° C. to 500° C.; and a period of time for the baking is in a range from 50 s to 500 s.

In some examples, the method further includes the following step.

The fluorescent agent is injected before the photoresist is subjected to exposing or after the photoresist is subjected to developing.

In some examples, the method further includes the following step.

The fluorescent agent is injected before a crosslinking reaction of the photoresist.

In some examples, injection energy of the fluorescent agent is smaller than 10 KeV.

In some examples, the defect includes any one or a combination of a photoresist residue defect and a photoresist deterioration defect.

According to the method for detecting a defect in the semiconductor fabrication process provided by the examples of the disclosure, the fluorescent agent is formed in the photoresist, and the fluorescent agent in the photoresist may absorb the light emitted by a detecting light source, convert the light into fluorescence and then emit the fluorescence, which is easily captured by an optical detector. Thus, emitting light intensity can be enhanced by a mode of injecting the fluorescent agent into the photoresist when a defect exists in the photoresist, the difficulty for detection of a defect in the photoresist can be lowered, and the sensitivity of the detection of a defect in the photoresist is improved.

DETAILED DESCRIPTION

The disclosure is further described in detail below in combination with accompanying drawings and examples. It may be understood that the specific examples described herein are only used for illustrating the disclosure but not for limiting the disclosure. It may be further noted that in order to facilitate description, the drawings only show part of but not all of structures related to the disclosure.

Figure 1:
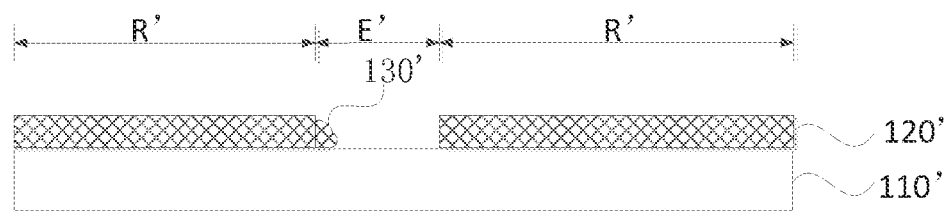
FIG. 1 is a schematic structural diagram of a photoresist residue after being subjected to developing provided by the related art.
Figure 2:
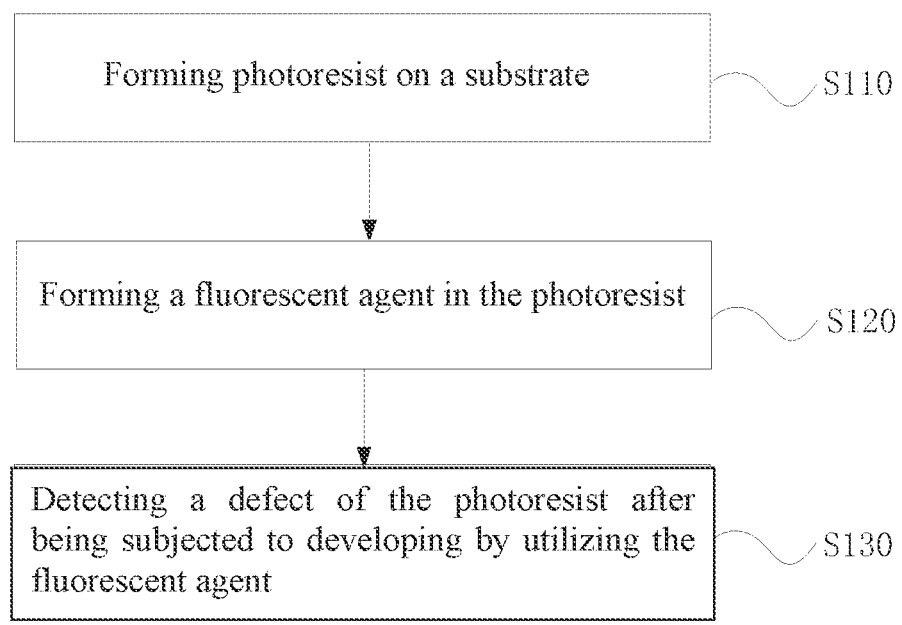
FIG. 2 is a flowchart of a method for detecting a defect in a semiconductor fabrication process provided by an example of the disclosure.

In view of problems mentioned in the background, examples of the disclosure provide a method for detecting a defect in a semiconductor fabrication process. FIG. 2 is a flowchart of a method for detecting a defect in a semiconductor fabrication process provided by an example of the disclosure. With reference to FIG. 2, the method includes the following operation.

At S110, photoresist is formed on a substrate.

In some examples, a material of the substrate may include a metal, a semiconductor, an organic material, an inorganic material or other materials known by those skilled in the art, which may be selected by those skilled in the art according actual situations and will not be limited herein. Besides, a functional film layer may be formed by patterning the substrate by a process of lithography. One complete semiconductor device is usually formed by stacking a plurality of functional film layers, and the substrate in S110 may be a substrate used for forming any functional film layer in a semiconductor device.

In some examples, the photoresist includes a positive photoresist or a negative photoresist. In some examples, the photoresist may be classified into two types of the negative photoresist or the positive photoresist according to its chemical reaction mechanism and development principle. The photoresist which forms an insoluble substance after irradiation is the negative photoresist. On the contrary, the photoresist which is insoluble for some solvents but forms a soluble substance after irradiation is the positive photoresist. Those skilled in the art may select photoresist according to actual situations. The photoresist is not limited herein.

In some examples, the photoresist with a preset and uniform thickness may be formed on the substrate by a spin-coating method or other methods known by those skilled in the art.

At S120, a fluorescent agent is formed in the photoresist.

The fluorescent agent is also known as a fluorescent brightener. It is a complex organic compound. A fluorescent agent molecule has a planar conjugated system of 7E electrons. In some examples, a structure of the fluorescent agent includes any one of —C═C—C═C—C═C— or —N═C—C═N—C═C— or a combination thereof. In some examples, —C═C—C═C—C═C— or —N═C—C═N—C═C— may be a ring or a moiety of a ring, particularly an aryl or heteroaryl ring. When the compounds with the above types of structures absorb ultraviolet rays, electrons are excited from the ground state to the active state and return to the ground state in a very short time, and emit fluorescent light. In some examples, a emission wavelength of the fluorescent agent is in a range from 420 nm to 450 nm. In some examples, the fluorescent agent may be any one of a toluylene based fluorescent agent, a coumarin based fluorescent agent, a pyrazoline based fluorescent agent, a benzoxazole based fluorescent agent and a dicarboximide based fluorescent agent, or any combination thereof.

At S130, a defect of the photoresist after being subjected to developing are detected by utilizing the fluorescent agent.

In some examples, the defect includes any one of a photoresist residue defect and a photoresist deterioration defect, or a combination thereof.

In some examples, if no defect exists in the photoresist after being subjected to developing, a region (referred to as an etching region), in which the photoresist should be removed, exposes the substrate, and a region (referred to as a reserved region), in which the photoresist should be reserved, is still covered by the photoresist on the substrate after the photoresist is developed. However, if the photoresist deteriorates due to a long-time storage, in proper storage conditions or other factors, the photoresist is not reacted or is not fully reacted during the exposure, and finally leads to fail in developing; alternatively, if the photoresist does not deteriorate, insufficient irradiation, insufficient developing or other factors in an exposure process also leads to fail in developing finally, in which, for example, the photoresist remains in the etching region.

Therefore a pattern of a mask plate differs from a pattern actually formed on the photoresist in either cases of the photoresist residue defect or the photoresist deterioration defect in the photoresist after it is subjected to developing. After the pattern of the photoresist is transferred onto the substrate, the pattern on the substrate will differ from the pattern of the mask plate, consequently the semiconductor device may be failure finally. Therefore, a detection for a photoresist defect is necessary.

In some examples, a defect detection process of the photoresist may be that the etching region and the reserved region are irradiated through a detection light source, then the intensity of the fluorescence from the etching region and the reserved region is obtained by an optical detector, and finally, whether there is any defect in the photoresist after developing can be determined according to the fluorescent intensity or the distribution of the fluorescent intensity.

Exemplarily, if there is a photoresist residue in the etching region, when the light from the detection light source irradiates the etching region, the photoresist will emit fluorescence. If no photoresist remains in the etching region, when the light of the detection light source irradiates the etching region, the photoresist will not emit fluorescence. Thus, the optical detector can determine whether there is any photoresist remaining in the etching region or not according to the fluorescence intensity in the etching region.

Exemplarily, if the photoresist in the etching region deteriorates and cannot be reacted during an exposure, the photoresist may exist in the etching region, and when the light of the detection light source irradiates the etching region, the photoresist emits fluorescence. If the photoresist in the etching region does not deteriorate, the reaction may be performed normally during the exposure, the photoresist may be removed normally during the follow-up developing, and when the light of the detection light source irradiates the etching region, the photoresist will not emit any fluorescence. Thus, the optical detector can determine whether there is any photoresist remaining in the etching region according to the intensity of the fluorescence in the etching region.

Exemplarily, if the photoresist in a reserved region is incomplete, when the light of the detection light source irradiates the reserved region, the intensity of the fluorescence emitted by the photoresist is lower than that of the fluorescence emitted by a complete photoresist in the reserved region. Thus, the optical detector can determine whether the photoresist in the reserved region is incomplete or not according to the intensity of the fluorescence in the reserved region.

According to the method for detecting a defect in the semiconductor fabrication process provided by the example of the disclosure, the fluorescent agent is formed in the photoresist, such that the fluorescent agent in the photoresist absorbs light emitted by the detection light source, converts the light into fluorescence and then emits the fluorescence, which is easily captured by the optical detector. Thus, the difference between the fluorescence intensity of the photoresist with a defect and that of the photoresist without a defect is greatly increased by means of forming the fluorescent agent in the photoresist, the difficulty for detection of a defect of the photoresist may be lowered, and a defect detection accuracy of the photoresist may be improved.

On the basis of the above technical solution, in some examples, the fluorescent agent is injected into the photoresist by means of an ion implantation.

The ion implantation is a process in which a dopant is ionized, accelerated and mass analyzed by an ion implanter to form a beam of high-energy ion flow composed of required impurity ions which is injected into a target, and the injection is thus completed by point-by-point scanning. In some examples, the fluorescent agent is the dopant, and the target is the photoresist. The ion implantation is used to inject the fluorescent agent into the photoresist so that a doping concentration and a doping depth of the fluorescent agent may be controlled accurately.

On the basis of the above technical solution, in some examples, a concentration of the fluorescent agent in the photoresist is larger than 0% and smaller than 1%.

In some examples, a definition of the concentration of the fluorescent agent in the photoresist herein is (mass of fluorescent agent/mass of photoresist)×100%. By arranging the concentration of the fluorescent agent to be larger than 0% and smaller than 1%, excessive fluorescent agent doped in the photoresist can be avoided, which guarantees the photosensitivity of the photoresist and the roughness of the developed photoresist are not affected by the doped fluorescent agent.

On the basis of the above technical solution, in some examples, a pH value of the photoresist with the fluorescent agent is larger than 0 and smaller than 6.

It may be understood that generally, with respect to chemically-amplified resist, when an exposure light source irradiates the photoresist, the photoresist will generate an acid which dissociates the resin component in the photoresist, thus the basic developing agent may dissolve the photoresist that is irradiated by the exposure light source. When a photoresist layer is acidic, photosensitivity of the photoresist is improved advantageously, and thus the light intensity required in the exposure process is not too high.

Figure 3:
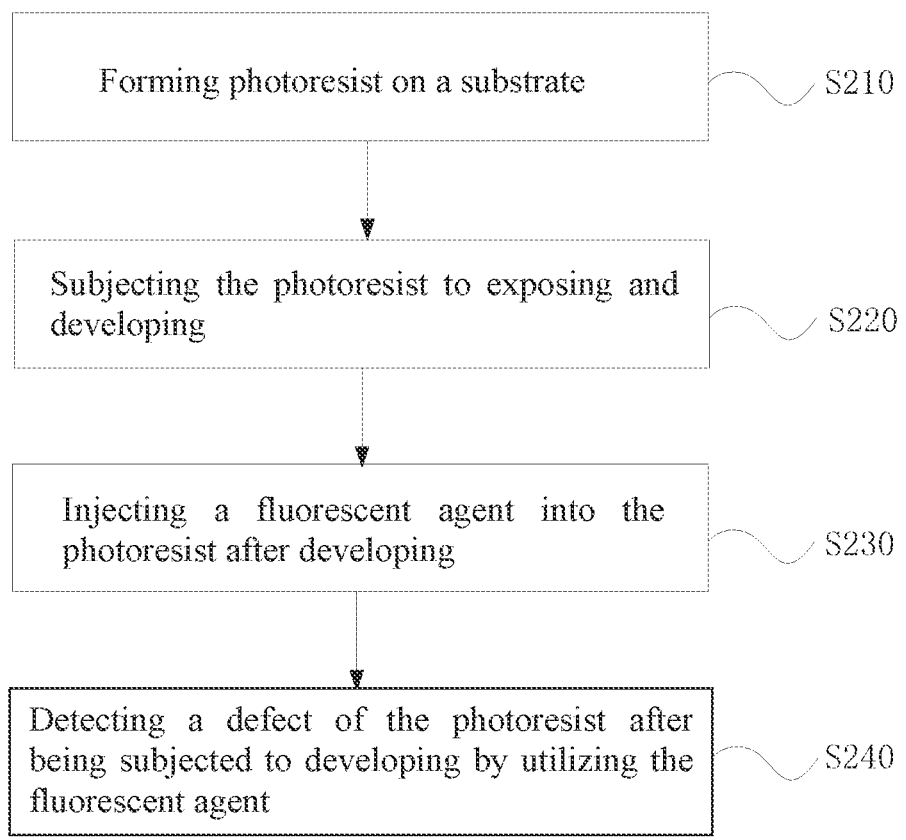
FIG. 3 is another flowchart of a method for detecting a defect in a semiconductor fabrication process provided by an example of the disclosure.

FIG. 3 is another flowchart of a method for detecting defects in a semiconductor fabrication process provided by an example of the disclosure. With reference to FIG. 3, the method includes the following operation.

At S210, the photoresist is formed on the substrate.

At S220, the photoresist is subjected to exposing and developing.

In some examples, exposing time and developing time of the photoresist may be arranged by those skilled in the art according to actual situations.

In some examples, if the photoresist is a positive photoresist, after being exposed and developed, the photoresist being irradiated is removed, and the photoresist not being irradiated is reserved, namely, the pattern on the mask plate may be transferred onto the photoresist. If the photoresist is a negative photoresist, after being exposed and developed, the photoresist being irradiated is reserved, and the photoresist not being irradiated is removed, namely, the pattern on the mask plate may be transferred onto the photoresist.

At S230, the fluorescent agent is injected into the photoresist after being subjected to developing.

It may be understood that the fluorescent agent is injected into the photoresist after being subjected to developing so as to prevent damage to the photoresist due to the ion implantation of the fluorescent agent, therefore, normal exposure and development of the photoresist are guaranteed, and thus the probability of accurately transferring the pattern from the mask plate to the photoresist is increased.

It may be further understood that by injecting the fluorescent agent into the photoresist after being subjected to developing, the area of the photoresist to be injected with the fluorescent agent may be reduced, thus consumption of the fluorescent agent is reduced, thereby reducing the cost of defect detection of the photoresist.

At S240, a defect of the photoresist after being subjected to developing are detected by utilizing the fluorescent agent.

According to the method for detecting a defect in the semiconductor fabrication process provided by the example of the disclosure, by injecting the fluorescent agent into the photoresist after being subjected to developing, effects of exposure and development of the photoresist may be prevented from being affected by the fluorescent agent injection process, thus the probability of successfully transferring the pattern of the mask plate is increased. In addition, the area of the photoresist to be injected with the fluorescent agent may be reduced, thus consumption of the fluorescent agent is reduced, thereby reducing the cost.

Figure 4:
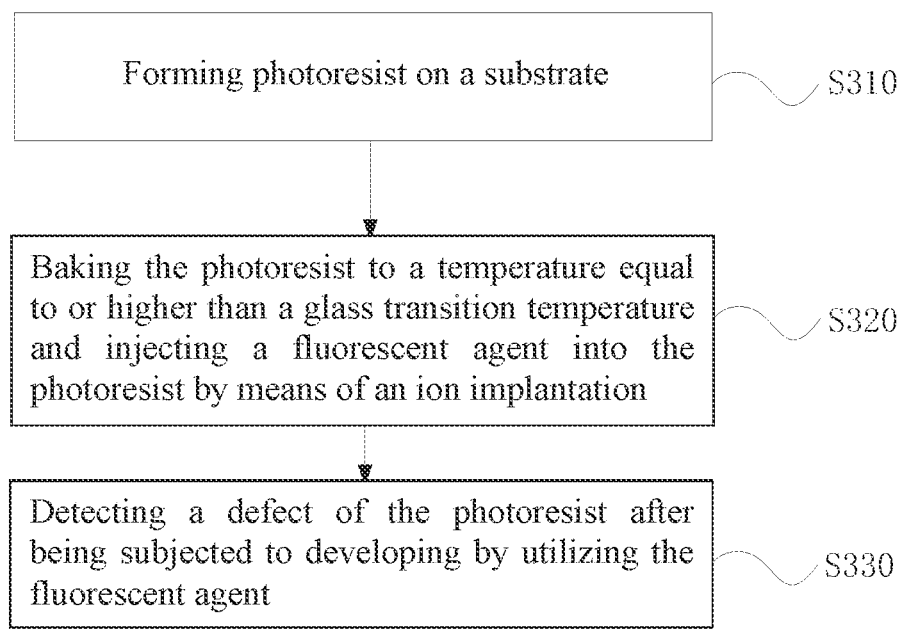
FIG. 4 is yet another flowchart of a method for detecting a defect in a semiconductor fabrication process provided by an example of the disclosure.

FIG. 4 is yet another flowchart of a method for detecting defects in a semiconductor fabrication process provided by an example of the disclosure. With reference to FIG. 4, the method includes the following operation.

At S310, the photoresist is formed on the substrate.

At S320, the photoresist is baked to a temperature equal to or higher than the glass transition temperature of the photoresist and then the fluorescent agent is injected into the photoresist by means of the ion implantation.

In some examples, the process that the photoresist is baked to a temperature equal to or higher than the glass transition temperature may be performed after the photoresist is applied, or after the exposure or after the development, which will not be limited herein and may be arranged by those skilled in the art according to the actual situations. Preferably, the fluorescent agent is injected before exposing the photoresist or after developing the photoresist. In such case, the effects of the exposure or development of the photoresist may be prevented from being affected by the fluorescent agent injection process.

In some examples, most of photoresists are isotropous polymers. When a temperature is higher than the glass transition temperature, a plenty of chain segments in a polymer can move in a mode of molecular movement, thereby performing viscous flow. When the temperature is lower than the glass transition temperature, molecular movement of the chain segments stops, and the polymer exhibits as glass. When the temperature is higher than the glass transition temperature, the polymer is easy to flow. Therefore, the photoresist is heated to its glass transition temperature for a period of time for an annealing treatment, and a more stable energy state may be achieved. Besides, when the photoresist is in a viscous flow state, an injection effect of the fluorescent agent is improved advantageously. Specifically, the fluorescent agent is injected to a relatively deeper position under relatively small injection energy and is uniformly distributed in the photoresist.

In some examples, a baking temperature is in a range from 50° C. to 500° C., and a baking time is from 50 s to 500 s. Accordingly, the photoresist may be prevented from being damaged due to an excessive high temperature, and the photoresist may be changed fully from a glassy state to the viscous flow state.

At S330, a defect of the photoresist after being subjected to developing is detected by utilizing the fluorescent agent.

According to the method for detecting a defect in the semiconductor fabrication process provided by the example of the disclosure, the photoresist is baked to a temperature equal to or higher than the glass transition temperature and then the fluorescent agent is injected into the photoresist by means of the ion implantation, so that the photoresist is in the viscous flow state during injection of the fluorescent agent, and the injection effect of the fluorescent agent is improved advantageously.

On the basis of the above technical solution, in some examples, the injection energy of the fluorescent agent is smaller than 10 KeV. Accordingly, the problem that the photoresist is damaged due to too high injection energy may be avoided.

On the basis of the above technical solution, in some examples, the fluorescent agent is injected before a cross-linking reaction of the photoresist. In some examples, after the crosslinking reaction of the photoresist, the photoresist is changed from the viscous flow state to a solid state. Thus the fluorescent agent is injected before the crosslinking reaction of the photoresist, namely the fluorescent agent is injected when the photoresist is in the viscous flow state, so that the fluorescent agent and the photoresist may be fully mixed, and the injection effect of the fluorescent agent is improved.

It should be noted that the above description is only preferred examples and applied technical principles of the disclosure. Those skilled in the art should understand that the disclosure is not limited to specific examples described herein, and may make various obvious changes, readjustments and substitutions without departing from the protection scope of the disclosure. Thus, described in detail through the above examples though, the disclosure is not limited only to the above examples, and may further include more other equivalent examples without departing from the concept of the disclosure. The scope of the disclosure is determined by the scope of the appended claims.

The invention claimed is:

1. A method for detecting a defect in a semiconductor fabrication process, comprising:
   forming photoresist on a substrate;
   forming a fluorescent agent in the photoresist before the photoresist is subjected to exposing; and
   detecting the defect of the photoresist after being subjected to developing by utilizing the fluorescent agent;
   wherein forming the fluorescent agent in the photoresist comprises: injecting the fluorescent agent into the photoresist using an ion implantation;
   wherein a structure of the fluorescent agent comprises any one or a combination of C=C—C=C—C=C— or —N=C—C=N—C=C—;
   wherein the fluorescent agent is any one or any combination of a toluylene based fluorescent agent, a coumarin based fluorescent agent, a pyrazoline based fluorescent agent, a benzoxazole based fluorescent agent and a dicarboximide based fluorescent agent;
   wherein a concentration of the fluorescent agent in the photoresist is larger than 0% and smaller than 1%;
   wherein a pH value of the photoresist formed with the fluorescent agent is larger than 0 and smaller than 6;
   wherein injection energy of the fluorescent agent is smaller than 10 KeV;
   wherein detecting the defect of the photoresist after being subjected to the developing by utilizing the fluorescent agent comprises: irradiating an etching region and a reserved region through a detection light source, then obtaining a fluorescent intensity from the etching region and the reserved region by an optical detector, wherein whether there is any defect in the photoresist after the developing is determined according to the fluorescent intensity or a distribution of the fluorescent intensity;
   wherein the defect comprises any one or a combination of a photoresist residue defect and a photoresist deterioration defect;
   wherein injecting the fluorescent agent into the photoresist using the ion implantation further comprises: baking the photoresist to a temperature equal to or higher than a glass transition temperature of the photoresist; and
   wherein injecting the fluorescent agent into the photoresist using the ion implantation further comprises injecting the fluorescent agent before a crosslinking reaction of the photoresist.

2. The method for detecting a defect in a semiconductor fabrication process of claim 1, wherein an emission wavelength of the fluorescent agent is in a range from 420 nm to 450 nm.

3. The method for detecting a defect in a semiconductor fabrication process of claim 1, wherein the temperature for the baking is in a range from 50° C. to 500° C.; and a period for the baking is in a range from 50 s to 500 s.

* * * * *